(12) United States Patent
Nielsen

(10) Patent No.: US 6,229,725 B1
(45) Date of Patent: May 8, 2001

(54) FULL BRIDGE CONVERTER CURRENT SENSE APPROACH USING VIRTUAL CURRENT SUMMING AND CANCELLATION

(75) Inventor: Keith E. Nielsen, Torrance, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/605,482

(22) Filed: Jun. 28, 2000

(51) Int. Cl.[7] .......................... H02M 7/44; H02M 7/5381

(52) U.S. Cl. ............................................. 363/132; 363/98

(58) Field of Search ................................ 363/17, 95, 98, 363/131, 132, 133, 139

(56) References Cited

U.S. PATENT DOCUMENTS

| | | | |
|---|---|---|---|
| 4,502,106 | * 2/1985 | Glennon | 363/56 |
| 4,626,979 | * 12/1986 | JaQuay | 363/41 |
| 4,651,267 | * 3/1987 | Nguyen et al. | 363/56 |
| 4,727,470 | * 2/1988 | Nilssen | 363/132 |
| 4,729,084 | * 3/1988 | Kataoka | 363/56 |
| 4,969,081 | * 11/1990 | Shekhawat et al. | 363/56 |
| 5,111,380 | * 5/1992 | Nilssen | 363/132 |
| 5,262,932 | * 11/1993 | Stanley et al. | 363/26 |

* cited by examiner

Primary Examiner—Peter S. Wong
Assistant Examiner—Bao Q. Vu
(74) Attorney, Agent, or Firm—T. Gudmestad

(57) ABSTRACT

The present invention discloses a method and system for sensing currents in a power converter. The system having two current sensing transformers each having two primary windings, a main transformer, and a plurality of switching elements. Each current sensing transformer uses one of its primary windings to sense rail current and the other primary winding to sense main transformer current. The method having a sensing a rail current using a first primary winding in a first current sensing transformer and a third primary winding in a second current sensing transformer, sensing a main transformer current using a second primary winding in the first current sensing transformer and a fourth primary winding in the second current sensing transformer, summing the current sensed in the first primary winding and the current sensed in the second primary winding in a secondary winding of the first current sensing transformer and creating a first virtual current therein, and summing the current sensed in the third primary winding and the current sensed in the fourth primary winding in a secondary winding of the second current sensing transformer and creating a second virtual current therein, wherein the first virtual current and the second virtual current are used to control an output of the power converter.

15 Claims, 8 Drawing Sheets

Phase Shift Converter Main Transformer Primary Current

Phase Shift Converter Current through 1 switch (either A or B) in Passive to Active leg Phase Shift Converter Current through 1 switch (either C or D) in Active to Passive leg

FULL BRIDGE CONVERTER CURRENT SENSE APPROACH USING VIRTUAL CURRENT SUMMING AND CANCELLATION

BACKGROUND OF THE INVENTION

1. Field of the Invention

This invention relates in general to electrical circuits, and in particular to a full bridge converter current sense approach using virtual current summing and cancellation.

2. Description of Related Art

Semiconductor components typically operate using direct current supplied at a low, closely controlled voltage. Close regulation of unipolar voltage is required because nearly all semiconductor components operate best at a constant power supply voltage.

Switch mode power supplies are widely included among the most efficient of regulated power supplies because they provide fine voltage regulation while minimizing unusable power over a wide range of unregulated unipolar input voltages and output currents. A typical application for a switch mode power supply is to connect the switch mode power supply to an unregulated, high voltage direct current input source, and use switching elements, an output transformer, output rectifying and filtering components, and a feedback control circuit controlling the switching elements to provide regulated power to the desired circuit.

Typically, to control the power transferred through the output transformer, the "on time" of the switching elements used to apply the voltage generated by the direct current input source to the output transformer is varied. The feedback control circuit generates control signals that are used to control the duty cycle of the switching elements, typically in response to a direct or indirect measure of the power drawn from the output transformer. This measure is typically done by current sensing the current drawn from the output transformer, usually in an indirect manner.

As observed above, detection of power drawn from an output transformer may be direct or indirect. In the full bridge topology, determining the current in the primary winding of the output transformer is desirable for current mode control of the feedback control circuitry. The current in the primary winding reflects current in the secondary winding and thus is related to power demanded by the load connected to the rectifying and filtering circuitry.

A full bridge power supply and voltage regulator has four arms, two of which carry the current through the primary at any given time. No current is carried by a given arm in the bridge at least half the time. Current sensing is typically performed using a current sensing transformer, and is typically performed in one of the arms which allows for reset of the current sensing transformer during the zero current periods. Typical related art approaches place the current transformer in either one of the legs, or next to the transformer, to allow the current transformer to reset. However, placement of the current sensing transformer in one of the legs prevents sensing of "shoot through" currents in one or both of the arms of the full bridge supply.

It can be seen, then, that there is a need in the art for a full bridge power supply that can accurately sense the current delivered by the power supply. It can also be seen, then, that there is a need in the art for a full bridge power supply that can sense shoot through currents in both legs of the supply.

SUMMARY OF THE INVENTION

To overcome the limitations in the prior art described above, and to overcome other limitations that will become apparent upon reading and understanding the present specification, the present invention discloses a method and system for sensing currents in a power converter. The system comprises a first current sensing transformer having a first primary winding and a second primary winding and a second current sensing transformer having a third primary winding and a fourth primary winding, a main transformer, and a plurality of switching elements. The third primary winding is coupled to the first primary winding of the first current sensing transformer. A primary winding of the main transformer is coupled in electrical series to the second primary winding and the fourth primary winding, such that the second primary winding and the fourth primary winding sense currents passing through the primary winding of the main transformer. The plurality of switching elements are coupled between the first primary winding of the first current transformer, the third primary winding of the second current transformer, and the main transformer.

The method comprises sensing a rail current using a first primary winding in a first current sensing transformer and a third primary winding in a second current sensing transformer, sensing a main transformer current using a second primary winding in the first current sensing transformer and a fourth primary winding in the second current sensing transformer, summing the current sensed in the first primary winding and the current sensed in the second primary winding in a secondary winding of the first current sensing transformer and creating a first virtual current therein, and summing the current sensed in the third primary winding and the current sensed in the fourth primary winding in a secondary winding of the second current sensing transformer and creating a second virtual current therein, wherein the first virtual current and the second virtual current are used to control an output of the power converter.

The present invention provides a full bridge power supply that can accurately sense the current delivered by the power supply. The present invention provides a full bridge power supply that can sense shoot through currents in both legs of the supply.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview of the Related Art Approaches

Several related art approaches have placed the current sensing transformer at various points within the circuit. These approaches are listed herein, along with explanations of their inherent weaknesses.

Single Current Sensing Transformer In Series With Primary Winding

Figure 1A:
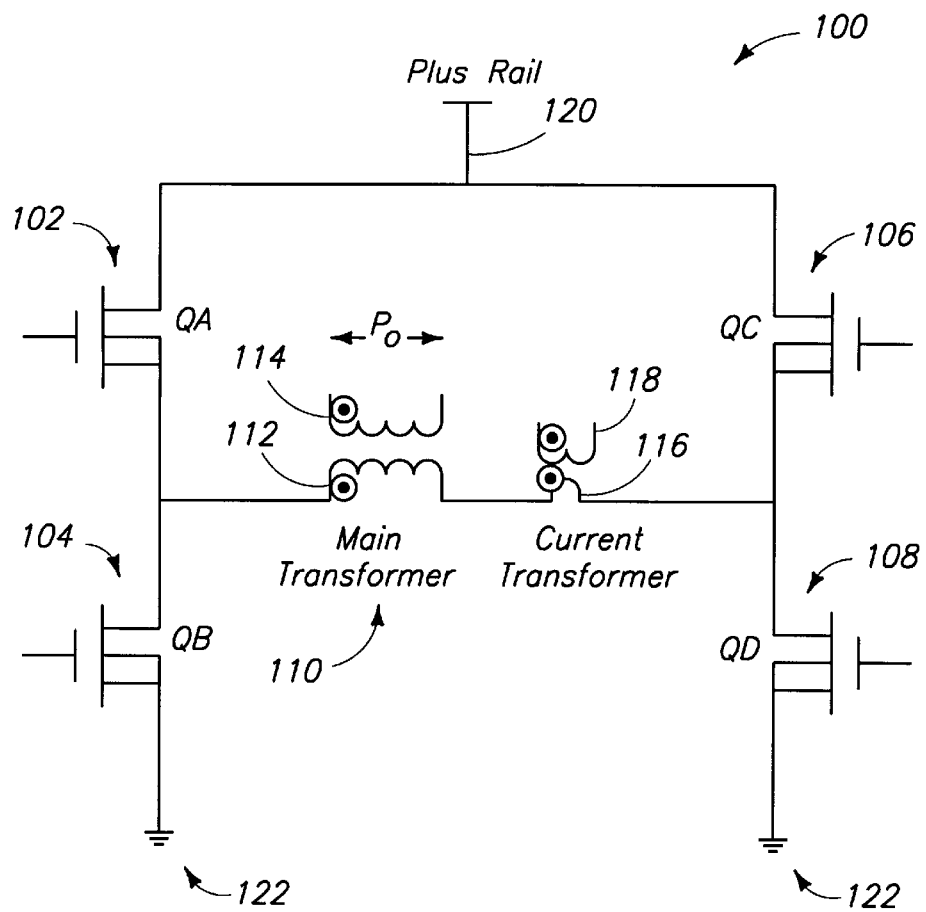
FIG. 1A illustrates a full bridge power supply using a single current sensing transformer coupled to the main transformer primary winding.

FIG. 1A illustrates a full bridge power supply using a single current sensing transformer coupled to the main transformer primary winding.

System 100 uses transistor A 102, transistor B 104, transistor C 106, and transistor D 108 as switching elements to control the current through main transformer 110. Main transformer 110 primary winding 112 is magnetically coupled to main transformer 110 secondary winding 114, which provides the regulated power output for system 100. Current sensing transformer 116 is coupled in series to the main transformer 110 primary winding. Secondary winding 118 of current transformer 116 is coupled to a feedback system to regulate the flow of current through switching elements 102–108. As the switching elements 102–108 switch current on and off through the legs of the system 100, the main transformer 110 primary winding receives varied currents, and therefore, varies the power available to the secondary winding 114. During switching of the switching elements 102–108, current through main transformer 110 and current sensing transformer 116 is not zero, and therefore, the flux in the current sensing transformer 116 cannot be reset, which prevents the main transformer 110 from receiving the proper current. Further, this approach does not sense any shoot-through currents that travel from the plus rail 120 to ground 122 through switching elements 102–104 (also called A-B shoot-through currents) or currents from the plus rail 120 to ground 122 through switching elements 106–108 (also called C-D shoot-through currents).

Figure 1B:
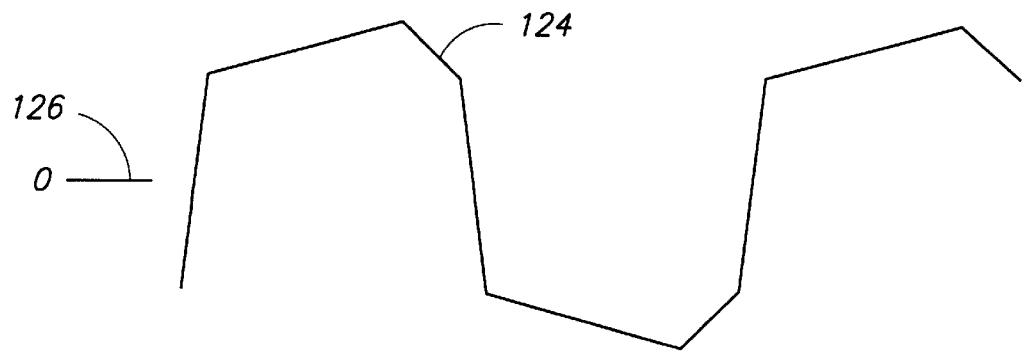
FIG. 1B illustrates the main transformer primary winding current, with zero reference, of the full bridge power supply of FIG. 1A.

FIG. 1B illustrates the main transformer 110 primary winding 112 current 124, with zero reference 126, of the full bridge power supply of FIG. 1A.

Single Current Sensing Transformer Coupled To Rail

Figure 2A:
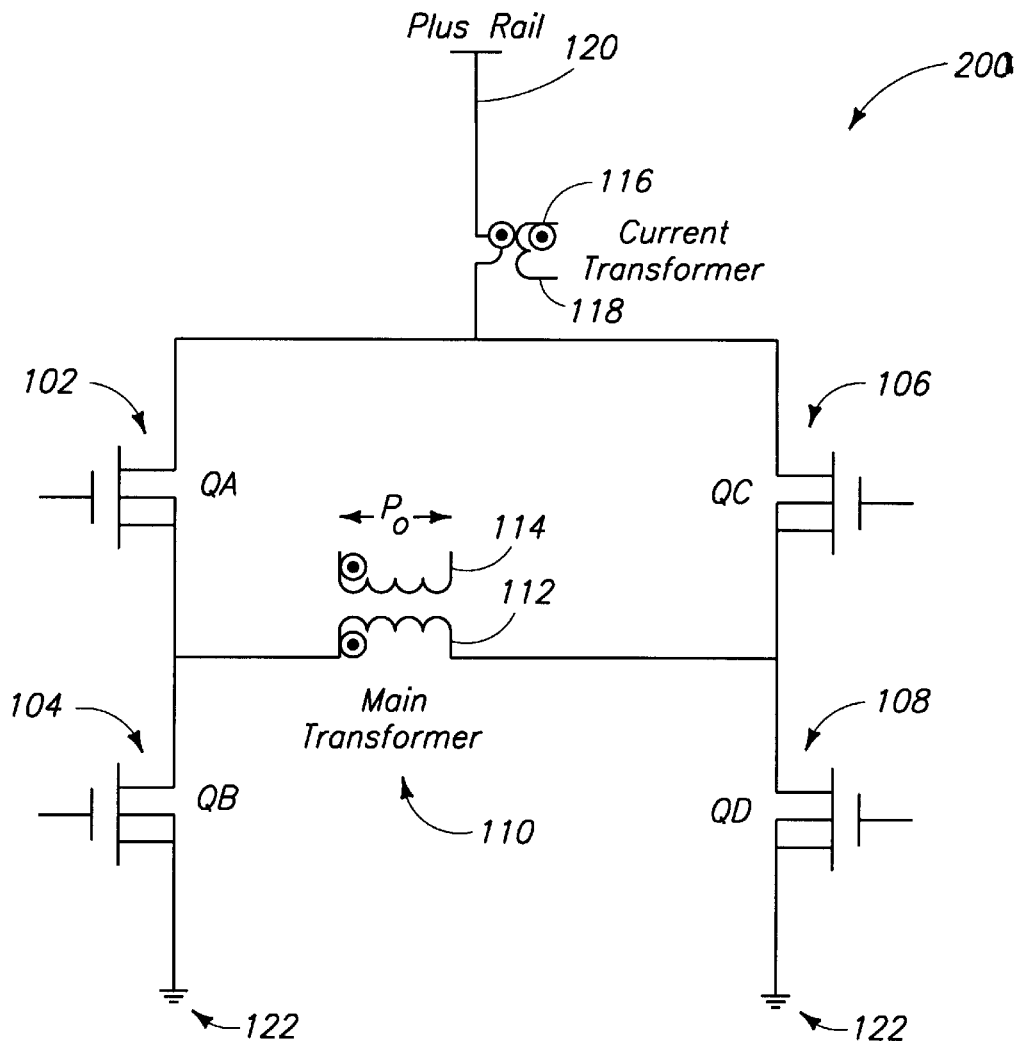
FIG. 2A illustrates a full bridge power supply using a single current sensing transformer coupled to one of the rails of the power supply.

FIG. 2A illustrates a full bridge power supply using a single current sensing transformer coupled to one of the rails of the power supply.

System 200 illustrates current sensing using a single current sensing transformer 116 coupled to the positive rail 120. A similar system 200 could use a single current transformer 116 coupled to ground 122 and similar results would be produced therefrom. System 200 has an inherent weakness because the reset for current sensing transformer 116 must now be extremely fast, because again, there are very few periods of time where there is zero current flow through current sensing transformer 116. In system 200, the current sensing transformer 116 must now reset in the transition time, e.g., at the system 200 maximum duty cycle. The current sense transformer 116 maximum duty cycle is then the same as the system 200 maximum duty cycle, and it is conceivable that a current sense transformer 116 could be forced to a duty cycle as high as 95%. In system 200, the current sense transformer 116 reset time is in direct conflict with the maximum duty cycle requirements and the lossless transition time for the system 200, also known as a phase shifted converter.

Figure 2B:
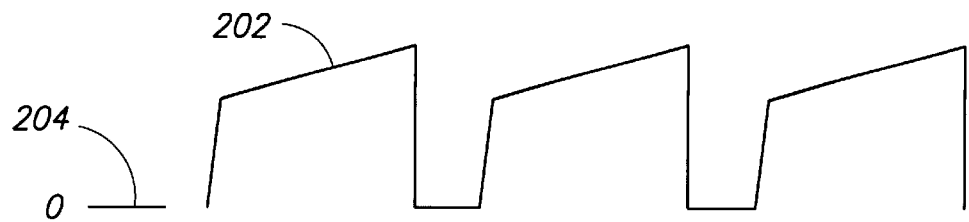
FIG. 2B illustrates the plus rail current, with zero reference, of the full bridge power supply of FIG. 2A.

FIG. 2B illustrates the plus rail 120 current 202, with zero reference 204, of the full bridge power supply of FIG. 2A.

Dual Current Sensing Transformers in A-B Leg

Figure 3A:
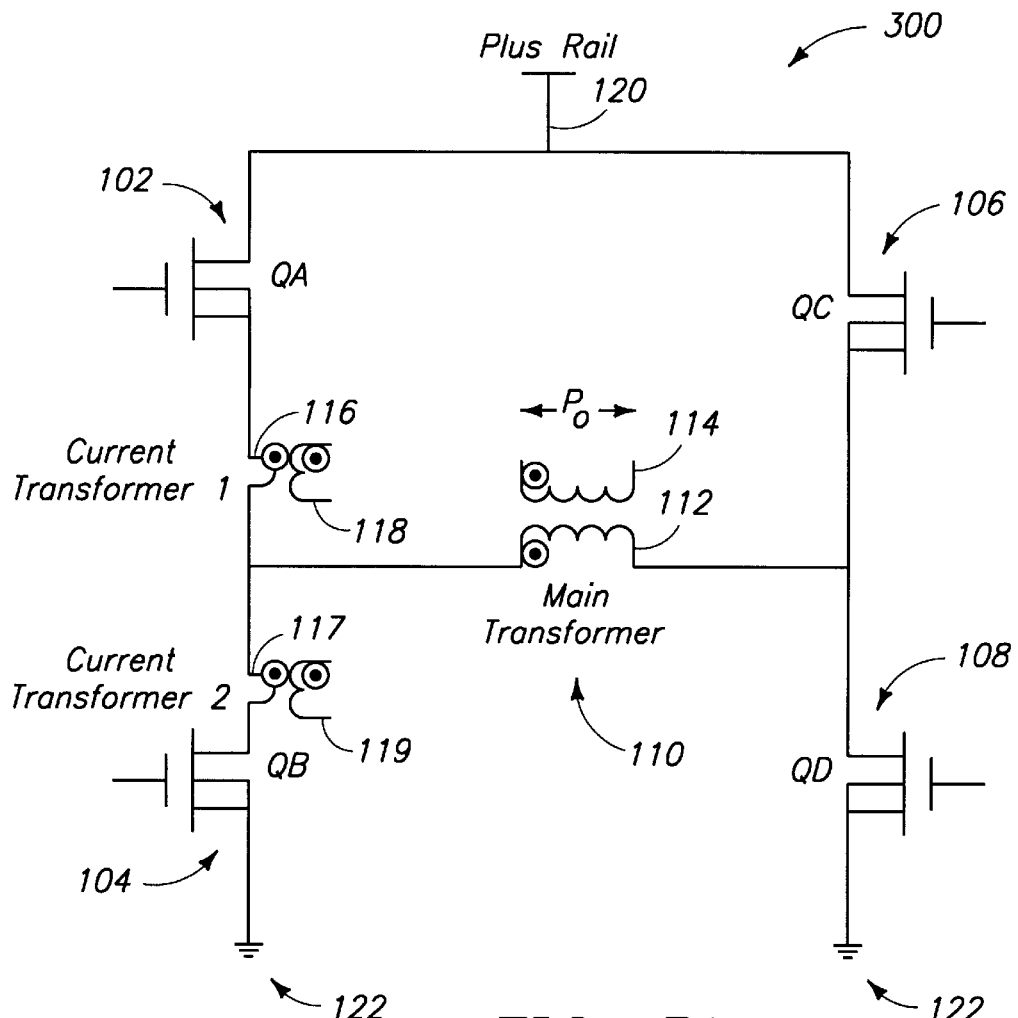
FIG. 3A illustrates a full bridge power supply using dual current sensing transformers coupled to the switching elements A and B.

FIG. 3A illustrates a full bridge power supply using dual current sensing transformers coupled to the switching elements A and B.

System 300 illustrates using two current sensing transformers 116 and 117 in one leg (called the Passive-to-Active leg) of the power supply. Current sensing transformer 116 is coupled between switching element 102 and main transformer 110 while current sensing transformer 117 is coupled between switching element 104 and main transformer 110. System 300 does allow the current sensing transformers 116 and 117 to reset properly, because there is an approximately 50% duty cycle even in a phase shift converter where there is a short duration negative spike due to the transitions of A-B or B-A. However, when the full bridge supply of system 300 is used as a phase shifted converter, the current sensed by current sensing transformers 116 and 117 also includes the positive circulating currents in the primary winding 112, which can cause control problems with the phase shift controller if the currents are not removed. Typical approaches to addresses this problem add circuitry to remove portions of the signal to the current feedback pin on the controller. Further, system 300 does not sense any shoot-through currents that travel from the plus rail 120 to ground 122 through switching elements 106–108.

Figure 3B:
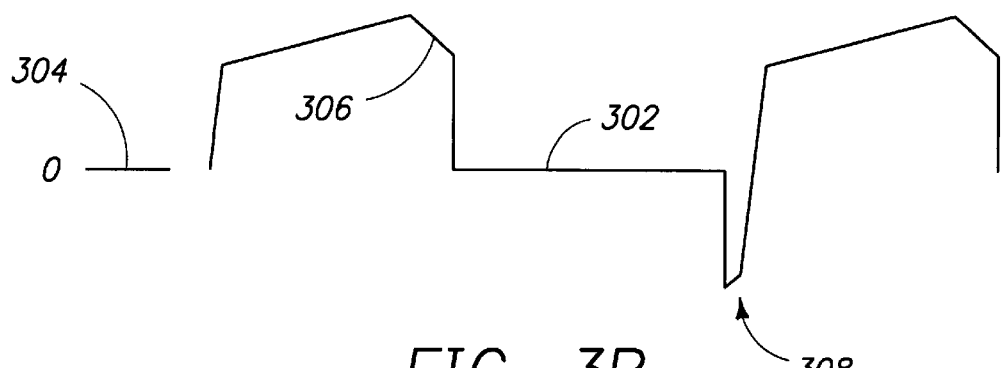
FIG. 3B illustrates the current through switching element A (or switching element B), with zero reference, of the full bridge power supply of FIG. 3A.

FIG. 3B illustrates the current 302 through switching element 102 (or switching element 104), with zero reference 304, of the full bridge power supply of FIG. 3A. Negative slop 306 typically interferes with the proper control, which requires sensing of the waveform peak, for system 300. The negative spike 308 is typically handled using a delay control in the controller for the system 300.

Dual Current Sensing Transformers in C-D Leg

Figure 4A:
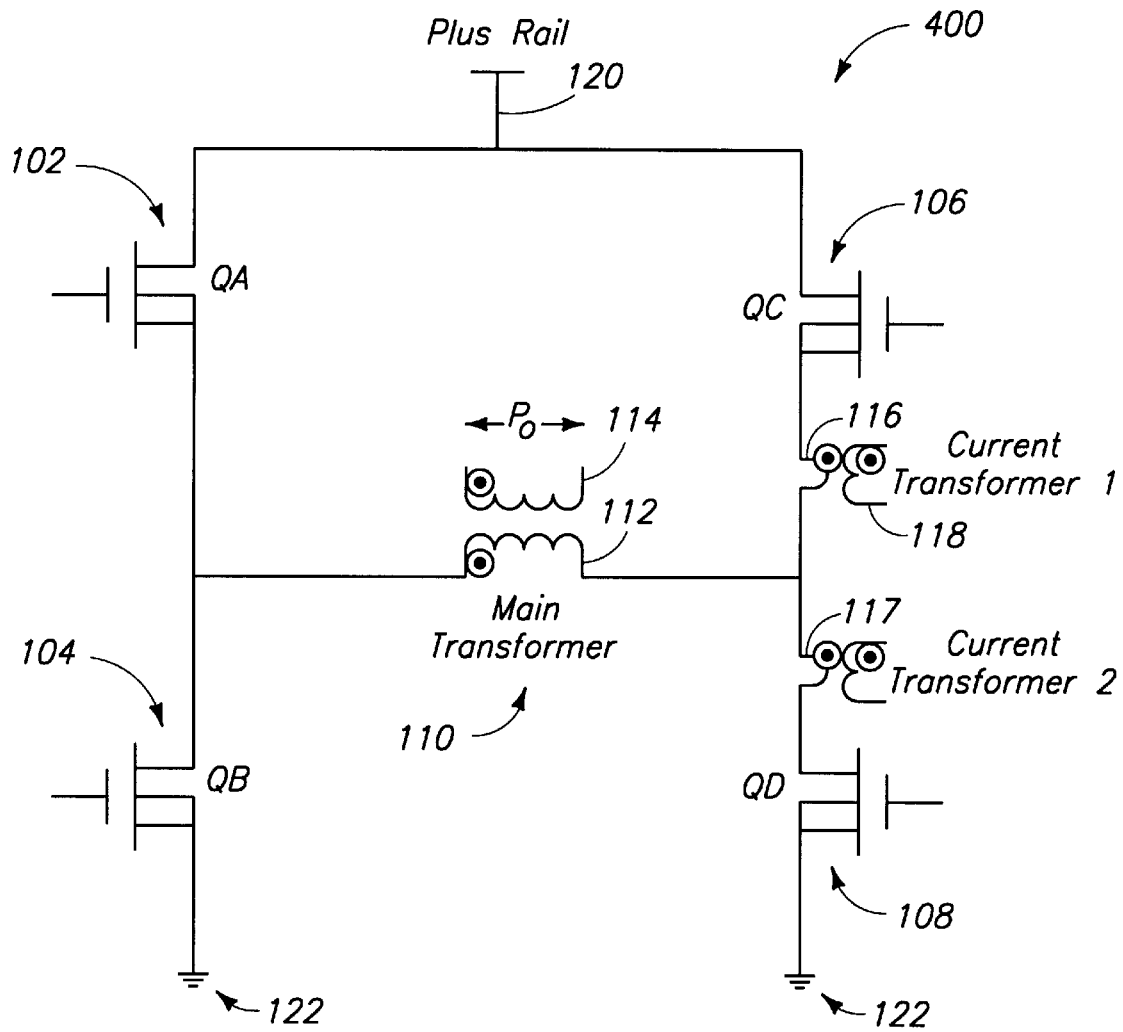
FIG. 4A illustrates a full bridge power supply using dual current sensing transformers coupled to the switching elements C and D.

FIG. 4A illustrates a full bridge power supply using dual current sensing transformers coupled to the switching elements C and D.

System 400 illustrates using two current sensing transformers 116 and 117 in the opposite leg (called the Active-to-Passive leg) of the power supply as that shown in FIG. 3A. Current sensing transformer 116 is coupled between switching element 106 and main transformer 110 while current sensing transformer 117 is coupled between switching element 108 and main transformer 110.

When system 400 is used as a phase shift converter, system 400 does not always allow the current sensing transformers 116 and 117 to reset properly because a 50% duty cycle can be exceeded in the negative direction since the negative current portion is the longer duration associated with the change from switches A-D to B-C to B-C to A-D. System 400 also has stability problems associated with the current sensing transformers 116 and 117 saturating in the negative direction then operating in the positive direction. Further, system 400 does not sense any shoot-through currents that travel from the plus rail 120 to ground 122 through switching elements 102–104.

Figure 4B:
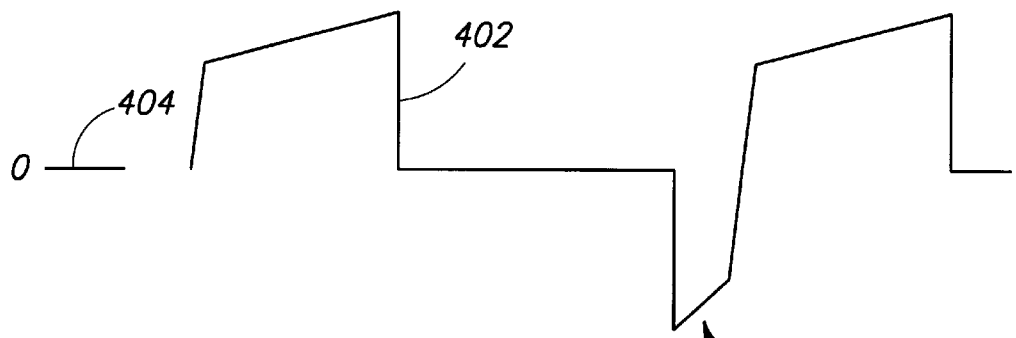
FIG. 4B illustrates the current through switching element C (or switching element D), with zero reference, of the full bridge power supply of FIG. 4A.

FIG. 4B illustrates the current 402 through switching element 106 (or switching element 108), with zero reference 404, of the full bridge power supply of FIG. 4A. The negative spike 406 cannot be controlled using a delay control as was the case in FIG. 3B, and furthermore, the negative spike 406 modulates with the amount of the load being placed across secondary winding 114.

Dual Current Sensing Transformers in C-D Leg with Diode Blocking

Figure 5A:
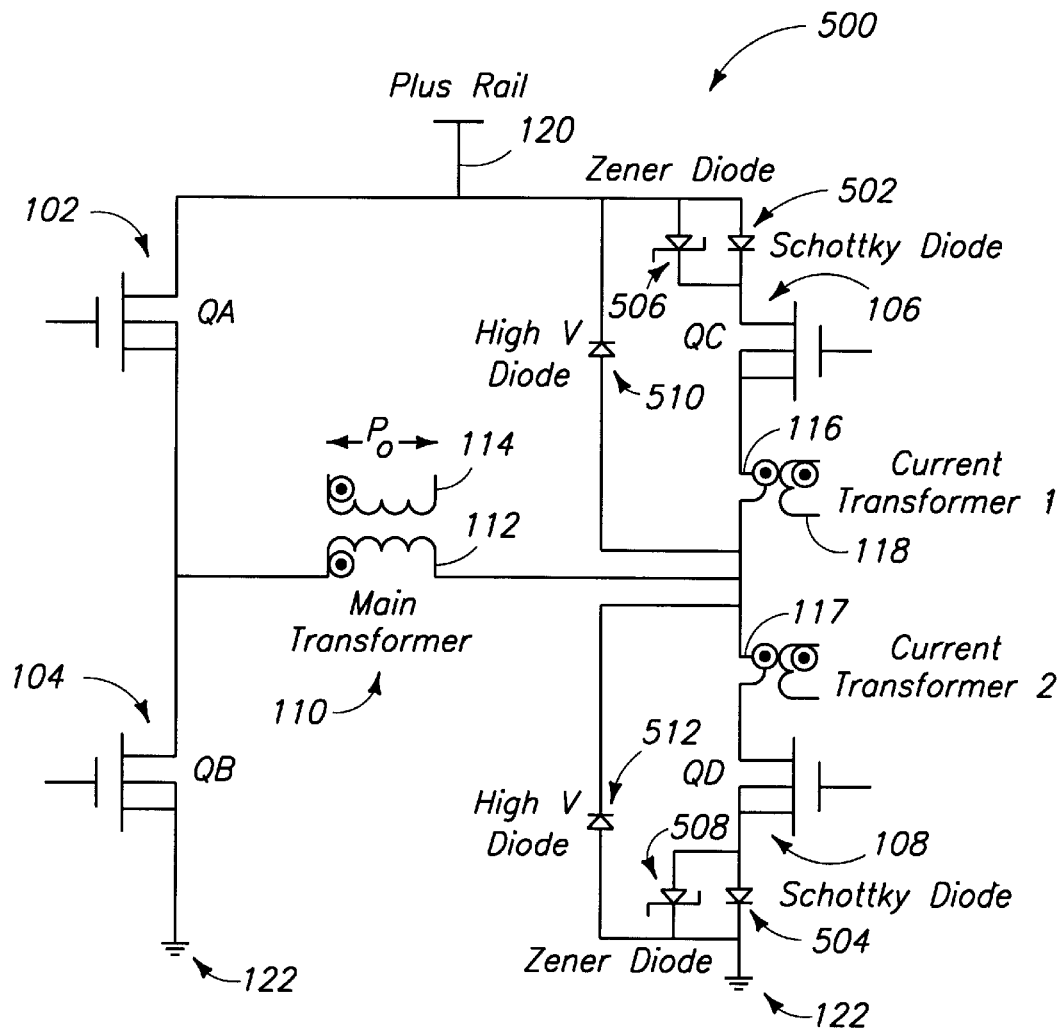
FIG. 5A illustrates a full bridge power supply using dual current sensing transformers coupled to the switching elements C and D, with diode blocking in the Active-to-Passive leg.

FIG. 5A illustrates a full bridge power supply using dual current sensing transformers coupled to the switching elements C and D, with diode blocking in the Active-to-Passive leg.

System 500 illustrates using two current sensing transformers 116 and 117 in a similar fashion as shown in FIG. 4A, but additional circuit elements have been added. For example, shottky diodes 502 and 504 have been added in the Active-to-Passive leg, zener diodes 506 and 508 have been added in parallel with shottky diodes 502 and 504, respectively, and high voltage diodes 510 and 512 have been added in parallel across the shottky diodes 502–504, switching elements 106 and 108, and current sensing transformers 116 and 117 respectively.

Although system 500 has advantages over system 400, e.g., system 500 now allows the current sensing transformers 116 and 117 to reset, the additional circuit elements cause a power loss in the Active-to-Passive leg due to the forward conduction loss of the shottky diodes 502–504. Further, system 500 does not remedy the deficiency of system 400, namely, system 500 does not sense any shoot-through currents that travel from the plus rail 120 to ground 122 through switching elements 102–104.

Figure 5B:
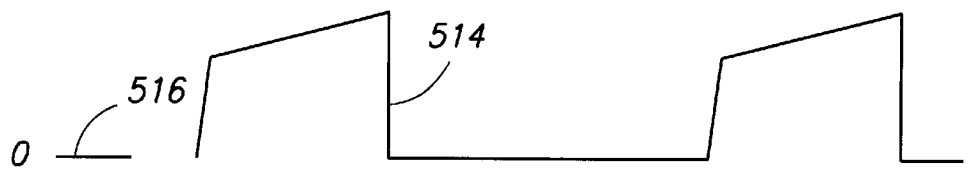
FIG. 5B illustrates the current through switching element C (or switching element D), with zero reference, of the full bridge power supply of FIG. 5A.

FIG. 5B illustrates the current 514 through switching element 106 (or switching element 108), with zero reference 516, of the full bridge power supply of FIG. 5A.

Overview of the Present Invention

Figure 6:
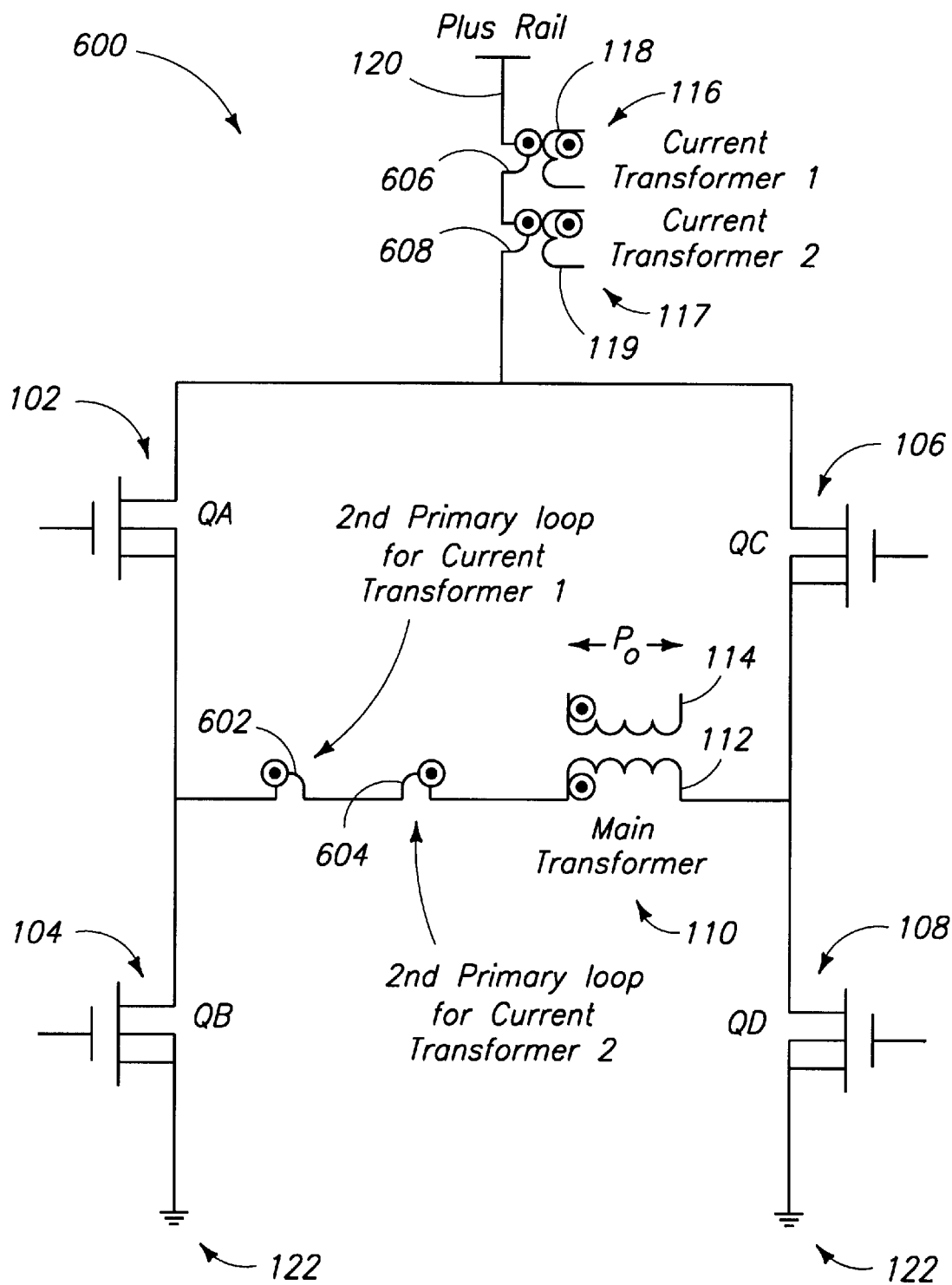
FIG. 6 illustrates the configuration of the present invention.

FIG. 6 illustrates the configuration of the present invention.

The present invention, as illustrated by system 600, uses a first current sensing transformer 116 and second current sensing transformer 117 in series with the positive rail 120. Similar results could be obtained by placing first current summing transformer 116 and second current sensing transformer 117 in series with ground 122. However, this configuration is probably not desirable since it complicates the drive circuitry to switching elements 104 and 108. Secondary winding 118 for first current sensing transformer 116 and secondary winding 119 for second current sensing transformer 117 are also shown.

First current sensing transformer 116 also has a second primary winding 602 that is coupled between switching elements 102 and 104 and the second primary winding 604 of the second current sensing transformer 117, which is coupled to main transformer 110. Primary winding 606 of first current sensing transformer 116 and primary winding 608 of second current sensing transformer 117 are also shown.

The primary windings 606 and 608 sense all the current being drawn from the plus rail 120, including shoot-through currents. However, each current sensing transformer can be reset, and maintains a maximum 50 percent duty cycle. The second primary windings 602 and 604 allow for sensing of the current directly through the main transformer 110.

Current sensing is done in system 600 by a virtual summing of the plus rail 120 current, or ground 122 current, and summing that current with the main transformer 110 primary 112 current. The current sensing transformer 116 (and 117) is a typical toroidal type of transformer, with a center hole where a wire loop can pass through which ordinarily forms the primary 118 (and 119). In system 600, two wires are passed through the center hole so that the current sensing transformers 116 and 117 have two primary windings, e.g., current sensing transformer 116 has a first primary winding 606 and a second primary winding 608, such that the current sensing transformers 116 and 117 see an effective (virtual) sum and cancellation effect of two currents from each of the primary windings on a given transformer 116 or 117.

To fully implement the system 600, two current sensing transformers 116 and 117 are used with like polarities to sense the plus rail 120 current, and use opposite polarities to sense the main transformer 110 primary winding 112 current. This configuration gives a 50% max duty cycle for each current transformer 116 and 117 due to the virtual sum and cancellation effect of the two primary (606 and 602, and 608 and 604) wire loop currents. This approach is particularly advantageous when used in a phase shifted full bridge converter.

System 600 allows each current transformer 116 and 117 to be easily reset due to the 50% duty cycle and the negative spike 710 in the case of the phase shifted full bridge converter of the present invention, does not place any large losses into the system 600, e.g., additional diodes in the forward path as described in FIG. 5A, avoids current sense and reset problems in phase-shifted converters associated with current sensing in either the passive-to-active (P-A) leg or active-to-passive (A-P) leg, and provides a current sense that will detect any shoot-through currents in addition to currents applied to the main transformer primary. The ability to sense all currents, including all shoot-through currents, is important to space applications and other applications that are single point failure sensitive, as failure to sense all currents could cause single event rupture and gate burn out, which in turn would cause a single point failure.

Any application where a full bridge converter or a half-bridge converter topology is used can be improved by implementing the present invention. These applications include phase shift and other resonant converters using a full or half-bridge converter. The full bridge converter is typically the best choice at higher power levels, e.g., greater than 200 watts, with higher input voltages, e.g., >50 volts, and the half bridge is typically the best choice at medium power levels, e.g., >50 watts with higher input voltages, e.g., >50 volts.

Figure 7A:
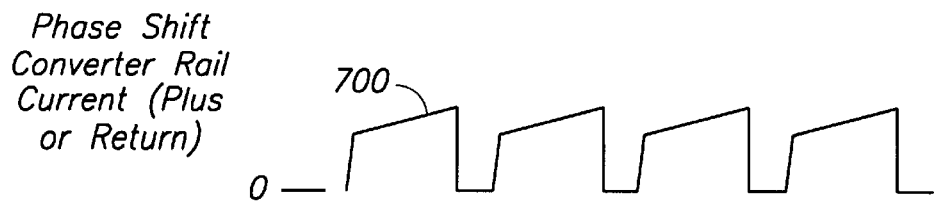
FIGS. 7A–D illustrate the currents at various points of the system illustrated in FIG. 6.
Figure 7B:
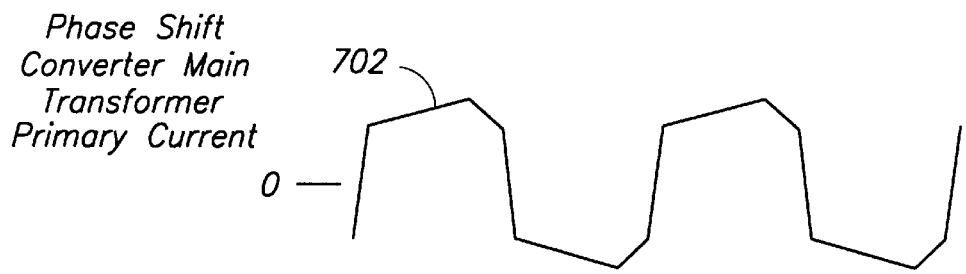
Figure 7C:
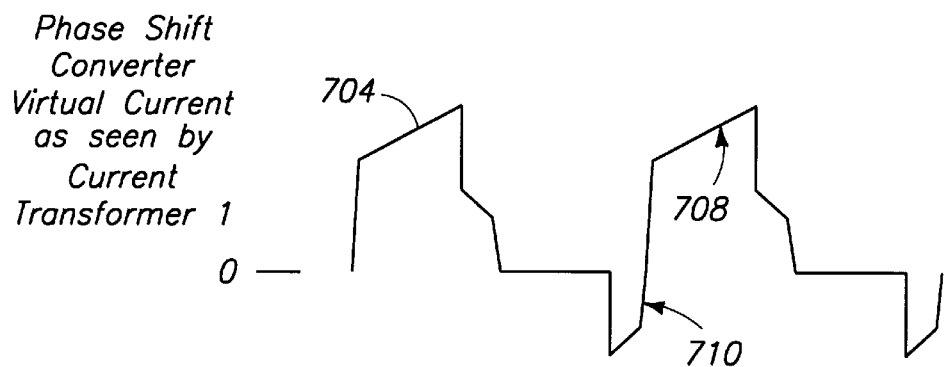
Figure 7D:
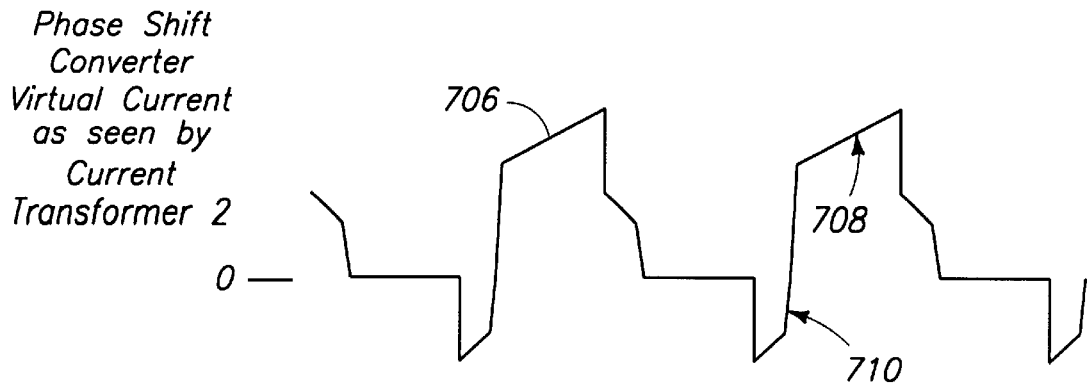

FIGS. 7A–D illustrate the currents at various points of the system illustrated in FIG. 6. FIG. 7A illustrates the current 700 at plus rail 120. FIG. 7B illustrates the current 702 at main transformer 110. FIG. 7C illustrates the "virtual" current 704 at current sensing transformer 116, and FIG. 7D illustrates the "virtual" current 706 at current sensing transformer 117.

Each of the virtual current transformer waveforms 704–706 has a maximum duty cycle of 50%, which can only vary a slight amount caused by variations in the recirculating currents of the phase modulated main transformer 110. The two ramps 708 and 710, ramp 708 being of a positive polarity and ramp 710 being of a negative polarity, do not cause control problems as described with respect to FIGS. 3B and 4B, since the durations of both ramps 708 and 710 do not modulate with load, the negative ramp 710 is not passed on to the controller, and the position portion 708 can be accommodated by the pulse width modulator. The negative portion 710 can be used to help provide a solid reset for the current transformer since the amplitude increase with load, and therefore with amplitude increases in the positive ramp 708, the two ramps 708 and 710 can be individually set through the use of diodes and burden resistors making the reset technique of the present invention reliable over wide load ranges.

Process Chart

Figure 8:
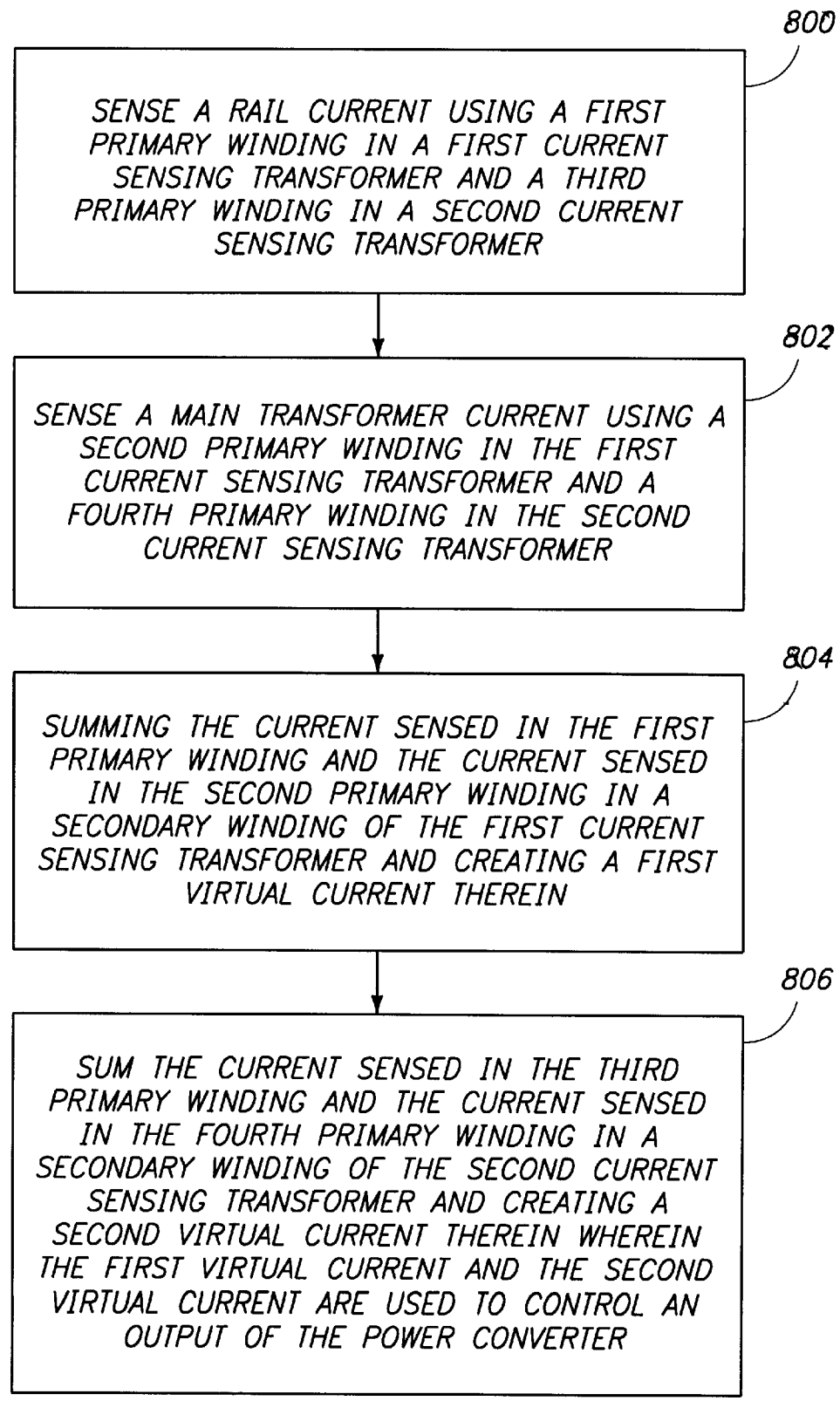
FIG. 8 is a flow chart illustrating exemplary steps used to practice the present invention.

FIG. 8 is a flow chart illustrating exemplary steps used to practice the present invention.

Block 800 illustrates performing the step of sensing a rail current using a first primary winding in a first current sensing transformer and a third primary winding in a second current sensing transformer.

Block 802 illustrates performing the step of sensing a main transformer current using a second primary winding in the first current sensing transformer and a fourth primary winding in the second current sensing transformer.

Block 804 illustrates performing the step of summing the current sensed in the first primary winding and the current sensed in the second primary winding in a secondary winding of the first current sensing transformer and creating a first virtual current therein.

Block 806 illustrates performing the step of summing the current sensed in the third primary winding and the current sensed in the fourth primary winding in a secondary winding of the second current sensing transformer and creating a second virtual current therein, wherein the first virtual current and the second virtual current are used to control an output of the power converter.

Conclusion

In summary, the present invention discloses a method and system for sensing currents in a power converter. The system comprises a first current sensing transformer having a first primary winding and a second primary winding and a second current sensing transformer having a third primary winding and a fourth primary winding, a main transformer, and a plurality of switching elements. The third party winding is coupled to the first primary winding of the first current sensing transformer. A primary winding of the main transformer is coupled in electrical series to the second primary winding and the fourth primary winding, such that the second primary winding and the fourth primary winding sense currents passing through the primary winding of the main transformer. The plurality of switching elements are coupled between the first primary winding of the first current transformer, the third primary winding of the second current transformer, and the main transformer.

The method comprises sensing a rail current using a first primary winding in a first current sensing transformer and a third primary winding in a second current sensing transformer, sensing a main transformer current using a second primary winding in the first current sensing transformer and a fourth primary winding in the second current sensing transformer, summing the current sensed in the first primary winding and the current sensed in the second primary winding in a secondary winding of the first current sensing transformer and creating a first virtual current therein, and summing the current sensed in the third primary winding and the current sensed in the fourth primary winding in a secondary winding of the second current sensing transformer and creating a second virtual current therein, wherein the first virtual current and the second virtual current are used to control an output of the power converter.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A current sensing system for sensing current in a power converter, comprising:
    a first current sensing transformer having a first primary winding and a second primary winding;
    a second current sensing transformer having a third primary winding and a fourth primary winding, wherein the third primary winding is coupled to the first primary winding of the first current sensing transformer;
    a main transformer, wherein a primary winding of the main transformer is coupled in electrical series to the second primary winding and the fourth primary winding, such that the second primary winding and the fourth primary winding sense currents passing through the primary winding of the main transformer; and
    a plurality of switching elements coupled between the first primary winding of the first current transformer, the third primary winding of the second current transformer, and the main transformer.

2. The system of claim 1, wherein a polarity of the second primary winding and a polarity of the fourth primary winding are opposite polarities.

3. The system of claim 2, wherein the first current transformer and the second current transformer are coupled to the positive rail to sense the positive rail current.

4. The system of claim 2, wherein the first current transformer and the second current transformer are coupled to the negative rail to sense the negative rail current.

5. The system of claim 1, wherein the power converter is a full bridge converter.

6. The system of claim 1, wherein the power converter is a half bridge converter.

7. The system of claim 1, wherein the power converter is a phase shifted full bridge converter.

8. A method for sensing current in a power converter, comprising:
    sensing a rail current using a first primary winding in a first current sensing transformer and a third primary winding in a second current sensing transformer;
    sensing a main transformer current using a second primary winding in the first current sensing transformer and a fourth primary winding in the second current sensing transformer;
    summing the current sensed in the first primary winding and the current sensed in the second primary winding in a secondary winding of the first current sensing transformer and creating a first virtual current therein; and
    summing the current sensed in the third primary winding and the current sensed in the fourth primary winding in a secondary winding of the second current sensing transformer and creating a second virtual current therein, wherein the first virtual current and the second virtual current are used to control an output of the power converter.

9. The method of claim 8, wherein a polarity of the second primary winding and a polarity of the fourth primary winding are opposite polarities.

10. The method of claim 9, wherein the first current transformer and the second current transformer are coupled to the positive rail to sense the positive rail current.

11. The method of claim 9, wherein the first current transformer and the second current transformer are coupled to the negative rail to sense the negative rail current.

12. The method of claim 8, wherein the power converter is a full bridge converter.

13. The method of claim 8, wherein the power converter is a half bridge converter.

14. The method of claim 8, wherein the power converter is a phase shifted full bridge converter.

15. The method of claim 8, wherein a positive ramp and a negative ramp of the summed current sensed in at least one of the first current sensing transformer and the second current sensing transformer are adjusted using diodes and burden resistors to achieve a reset in the current sensing transformer where the summed current is sensed.

* * * * *